United States Patent [19]

Harman

[11] Patent Number: 5,033,110

[45] Date of Patent: Jul. 16, 1991

[54] FREQUENCY CONVERTER FOR A RADIO COMMUNICATIONS SYSTEM

[75] Inventor: Stephen G. Harman, Nepean, Canada

[73] Assignee: Northern Telecom Limited, Montreal, Canada

[21] Appl. No.: 524,904

[22] Filed: May 18, 1990

[51] Int. Cl.$^5$ .......................... H04B 1/04; H04B 1/10
[52] U.S. Cl. .................... 455/114; 455/126; 455/302; 455/317
[58] Field of Search ............... 455/109, 114, 116, 118, 455/126, 209, 302, 311, 317; 331/3

[56] References Cited

U.S. PATENT DOCUMENTS

| | | | |
|---|---|---|---|
| 4,243,955 | 1/1981 | Daniel et al. | 332/37 D |
| 4,591,859 | 5/1986 | Campbell | 343/5 AF |
| 4,700,151 | 10/1987 | Nagata | 332/18 |
| 4,811,425 | 3/1989 | Feerst | 455/317 |

*Primary Examiner*—Reinhard J. Eisenzopf
*Assistant Examiner*—Chi H. Pham
*Attorney, Agent, or Firm*—R. John Haley

[57] ABSTRACT

A frequency converter for a transmitter of a microwave radio communications system comprises an image reject mixer for mixing an IF signal with an LO or carrier frequency signal to produce an RF signal, and a nulling circuit for providing d.c. offsets to the image reject mixer to reduce carrier leak to the RF signal. The nulling circuit includes a source of phase quadrature chopper signals which are cross modulated with the LO signal to produce a modulated signal, and a single-ended mixer for mixing the modulated signal with part of the RF signal. The output of the single-ended mixer is low pass filtered and the resulting filtered signal is cross demodulated with the chopper signals to produce phase quadrature correction signals, which are integrated to produce the d.c. offsets for the image reject mixer. The arrangement avoids the need for, and expense of, a subsequent carrier frequency filter.

8 Claims, 1 Drawing Sheet

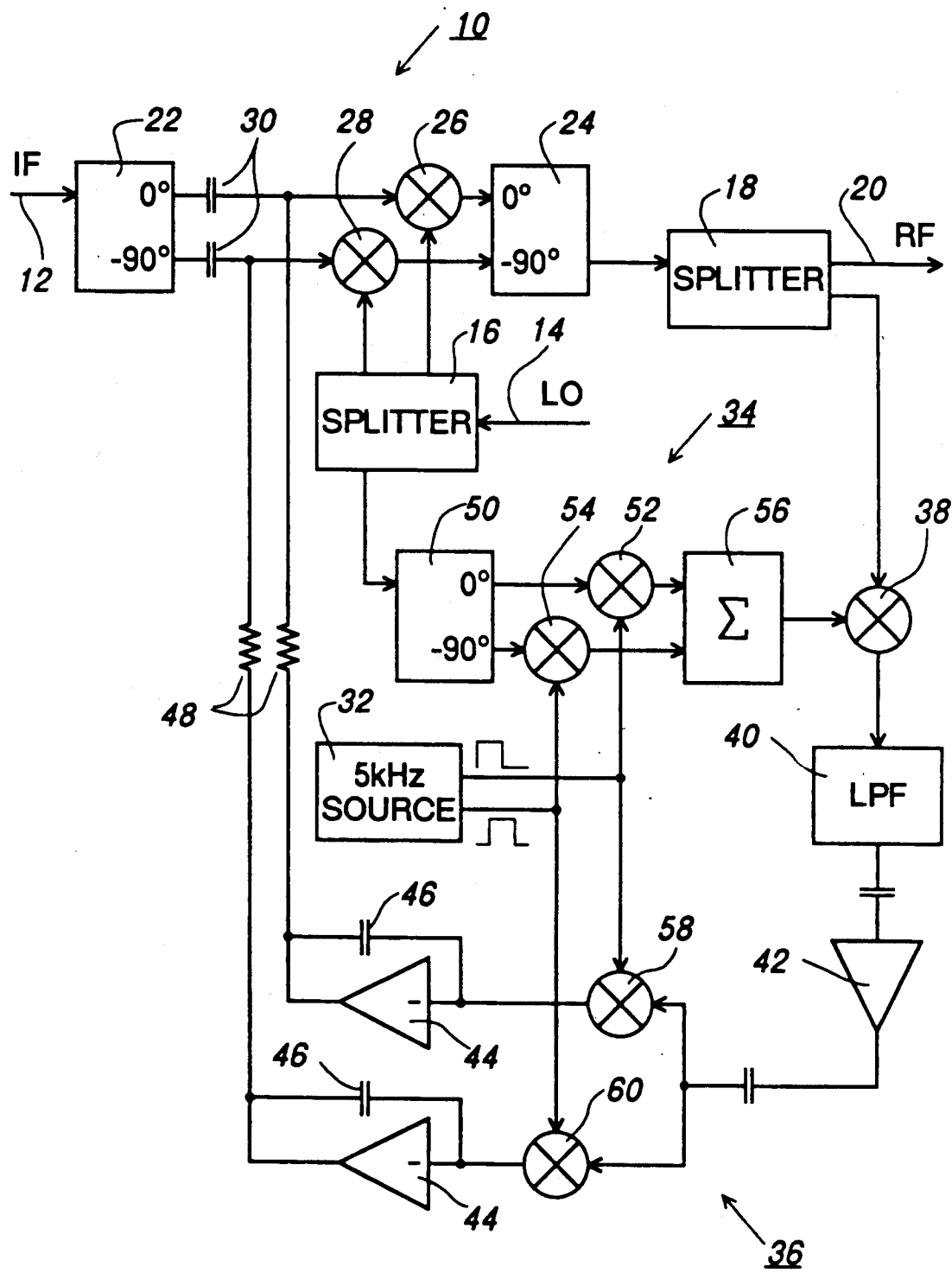

FREQUENCY CONVERTER FOR A RADIO COMMUNICATIONS SYSTEM

This invention relates to frequency converters, and is particularly concerned with an up-converter for a microwave radio communications system.

BACKGROUND OF THE INVENTION

It is well known to mix, at the transmitter of a microwave radio communications system using QAM (quadrature amplitude modulation), an IF (intermediate frequency) signal with an LO (local oscillator) signal to produce an RF (radio frequency) signal which contains sidebands above and below the LO frequency, referred to as the carrier frequency. Only a selected one of the sidebands is transmitted, the other sideband and the carrier frequency being suppressed. A double balanced image reject mixer is desirably used to facilitate this. Because the signal frequency is increased, this is referred to as an up-conversion.

With such systems increasingly using more QAM states and requiring increased dynamic range, there is an increasing need to improve signal-to-noise ratio. This leads to increased transmitter power levels. Consequently there is a need to improve the suppression of the suppressed sideband and carrier frequency components from the output of the image reject mixer, and hence from the signal to be amplified and transmitted. Because the carrier frequency is closer than the suppressed sideband to the transmitted, selected, sideband, and is at a relatively higher level due to the nature of the image reject mixer, the presence of carrier frequency components at the output of the frequency converter presents a particular problem.

This problem is exacerbated by the fact that, for linear operation of the image reject mixer, the IF signal must be supplied to the mixer at a much lower level than the LO signal. Consequently, carrier frequency components which appear at the output of the image reject mixer due to imperfect balance can have a magnitude which is comparable to that of the selected sideband RF signal.

In order to remove such undesired carrier frequency components, referred to below as carrier leak, before amplification of the RF signal in the transmitter's power amplifier, it is known to provide a filter between the output of the frequency converter and the input of the power amplifier. However, such a filter operates at microwave frequencies and must meet stringent requirements in order to pass the desired sideband while sufficiently suppressing the carrier leak, and accordingly is expensive.

An object of this invention, therefore, is to provide an improved frequency converter in which carrier leak is substantially reduced.

SUMMARY OF THE INVENTION

According to one aspect of this invention there is provided a frequency converter comprising: complex mixing means for mixing an IF (intermediate frequency) signal with an LO (local oscillator) signal to produce an RF (radio frequency) signal; means for cross modulating the LO signal with a low frequency signal to produce a complex modulated signal; single-ended mixing means for mixing the complex modulated signal with a portion of the RF signal to produce a resultant signal; means for cross demodulating a low frequency part of the resultant signal with the low frequency signal to produce a complex feedback signal; and means for supplying the complex feedback signal to the complex mixing means to reduce components at the LO frequency in the RF signal.

The complex mixing means is preferably an image reject mixer.

In a preferred embodiment of the invention the cross modulation means comprises means for providing two phase quadrature components of the LO signal; means for modulating each phase quadrature component of the LO signal with a respective one of two phase quadrature components of the low frequency signal; and means for summing the modulation products to produce the complex modulated signal.

In this case preferably the means for cross demodulating comprises means for low pass filtering the resultant signal to produce a filtered signal, and means for mixing the filtered signal with each phase quadrature component of the low frequency signal to produce two phase quadrature components of the complex feedback signal.

The means for supplying the complex feedback signal then conveniently comprises means for integrating each phase quadrature component of the complex feedback signal and for supplying each integrated phase quadrature component to a respective phase quadrature path of the image reject mixer.

According to another aspect of this invention there is provided a frequency converter comprising an image reject mixer, for mixing an IF (intermediate frequency) signal with an LO (local oscillator) signal to produce an RF (radio frequency) signal, and a nulling circuit for providing d.c. offsets to the image reject mixer to reduce signal components at the LO frequency in the RF signal, the nulling circuit comprising: a source of phase quadrature chopper signals; means for cross modulating the LO signal with the chopper signals to produce a modulated signal; a single-ended mixer for mixing the modulated signal with part of the RF signal; means for low pass filtering the output of the single-ended mixer to produce a filtered signal; means for cross demodulating the filtered signal with the chopper signals to produce phase quadrature correction signals; and means for integrating the phase quadrature correction signals to produce the d.c. offsets for the image reject mixer.

According to a further aspect this invention provides a method of reducing LO (local oscillator) frequency components in an RF (radio frequency) signal produced by mixing an IF (intermediate frequency) signal with the LO signal in an image reject mixer, comprising the steps of: supplying phase quadrature chopper signals; cross modulating the LO signal with the chopper signals and summing the result to produce a complex modulated signal; mixing the complex modulated signal with a part of the RF signal in a single mixer and low pass filtering the result to produce a filtered signal; cross demodulating the filtered signal with the chopper signals to produce phase quadrature feedback signals; and integrating the phase quadrature feedback signals and supplying resulting d.c. offset signals to respective phase quadrature paths of the image reject mixer.

BRIEF DESCRIPTION OF THE DRAWING

The invention will be further understood from the following description with reference to the acompanying drawing, which illustrates in the form of a block diagram a frequency converter in accordance with an embodiment of the invention.

Referring to the drawing, the frequency converter comprises a double balanced image reject mixer 10 which is supplied with an IF (intermediate frequency) signal on an IF input line 12 and with an LO (local oscillator) signal via an LO input line 14 and a splitter 16, and which produces an upper sideband RF (radio frequency) signal which is coupled via a splitter 18 to RF output line 20. For example the frequencies of the IF and LO signals may be of the order of 140 MHz and 4 GHz respectively.

The image reject mixer 10 is of generally known form, comprising two phase quadrature hybrid couplers 22 and 24 and two mixers 26 and 28. The IF signal is supplied, at a low level for linear operation of the image reject mixer, from the line 12 to an input of the coupler 22, whose phase quadrature (0° and −90°) outputs are coupled, via capacitors 30 for d.c. isolation, to signal ports of the mixers 26 and 28 respectively. Local oscillator ports of these mixers 26 and 28 are supplied with the LO signal, at a relatively high level, from the splitter 16, and outputs of these mixers are coupled to phase quadrature (0° and −90°) inputs of the coupler 24, whose output is coupled to the splitter 18 and hence to the RF output line 20.

As already described above, especially in view of the relatively high level of the LO signal, a carrier leak, or signal component at the LO or carrier frequency, can occur at the output of the image reject mixer 10 due to imperfect balance, and must be removed before amplification of the RF signal. In this embodiment of the invention, this carrier leak is substantially completely removed by feedback compensation or nulling as described below, so that there is no need for a subsequent carrier frequency filter. Accordingly, the feedback circuitry described below is referred to as nulling circuitry, because it serves to null the carrier leak, or reduce it substantially, so that it is removed from the signal on the RF output line 20.

The nulling circuitry is chopper stabilised by a 5 kHz chopper signal source 32 which produces at its outputs two 5 kHz square waves which are in phase quadrature, i.e. whose waveforms are offset in time by one quarter of a period of the square wave, in order to achieve a high isolation between phase quadrature signal components. The drawing illustrates, adjacent the respective outputs of the source 32, the relative timing of the waveforms at these outputs. These chopper signals are supplied to a cross or 4-phase modulator 34 and to a cross demodulator 36 which form part of the nulling circuitry. The nulling circuitry also comprises a single-ended mixer 38, a low pass filter (LPF) 40, a capacitively coupled amplifier 42, and two integrating amplifiers 44 each of which includes a negative feedback integrating capacitor 46 and an coupling resistor 48.

The 4-phase modulator 34 comprises a quadrature hybrid coupler 50, two mixers 52 and 54, and a summing circuit 56. A portion of the LO signal on the line 14 is supplied via the splitter 16 to an input of the coupler 50, whose phase quadrature (0° and −90°) outputs are coupled to signal ports of the mixers 52 and 54 respectively. Local oscillator ports of these mixers 52 and 54 are supplied with the phase quadrature chopper signals from the source 32, and outputs of these mixers are summed by the summing circuit 56, whose output is coupled to a local oscillator port of the single-ended mixer 38. A small portion of the RF signal supplied to a signal port of the single-ended mixer 38 from the splitter 18.

The output of the single-ended mixer 38 is supplied to the LPF 40, which has a bandwidth of the order of 40 kHz and hence sufficient to pass the 5 kHz square waveform of the chopper signals. The output of this filter 40 is amplified by the amplifier 42 and supplied to signal ports of two mixers 58 and 60, which constitute the cross demodulator 36 and whose local oscillator ports are supplied with the phase quadrature chopper signals, respectively. Output signals of these mixers 58 and 60 are integrated by the integrating amplifiers 44 to produce d.c. offset signals which are coupled via the resistors 48 to the phase quadrature paths, respectively, of the image reject mixer 10 between the capacitors 30 and the signal ports of the mixers 26 and 28.

In operation, although the mixer 38 is single-ended it provides a quadrature, or arbitrary phase, output because it is supplied with quadrature or arbitrary phase signals at its signal and local oscillator ports. Furthermore, this mixer 38, together with the low pass filter 40 and the amplifier 42, operates in a chopper-stabilised loop between the 4-phase modulator 34 and the cross demodulator 36. Consequently, these parts of the nulling circuitry serve to monitor arbitrary phases of carrier leak at the output of the image reject mixer 10.

The phase quadrature outputs of the mixers 58 and 60 are integrated and fed back as d.c. offset signals to the image reject mixer phase quadrature paths, as described above, in order to compensate for and hence null such arbitrary phase carrier leak. The time constant of the integrating amplifiers 44 can be relatively large, as the carrier leak for any particular image reject mixer is subject to rapid change.

A frequency converter as described above, using a single-ended mixer 38 and chopper stabilisation, has been found to achieve a reduction in carrier leak in the RF output signal of about 65 to 70 dB. This is sufficient to avoid the need for, and costs of, using either a subsequent high quality carrier frequency filter or a phase quadrature mixer in place of the single-ended mixer 38.

Although the embodiment of the invention described above relates to a particular configuration and particular frequencies, it should be appreciated that the invention is applicable to frequency converters generally, and that numerous modifications, variations, and adaptations may be made without departing from the scope of the invention as defined in the claims.

What is claimed is:

1. A frequency converter comprising:
    complex mixing means for mixing an IF (intermediate frequency) signal with an LO (local oscillator) signal to produce an RF (radio frequency) signal;
    means for cross modulating the LO signal with a low frequency signal to produce a complex modulated signal;
    single-ended mixing means for mixing the complex modulated signal with a portion of the RF signal to produce a resultant signal;
    means for cross demodulating a low frequency part of the resultant signal with the low frequency signal to produce a complex feedback signal; and
    means for supplying the complex feedback signal to the complex mixing means to reduce components at the LO frequency in the RF signal.

2. A frequency converter a claimed in claim 1 wherein the complex mixing means comprises an image reject mixer.

3. A frequency converter as claimed in claim 2 wherein the complex feedback signal comprises two phase quadrature components and the means for supplying the complex feedback signal to the complex mixing means comprises means for integrating each phase quadrature component and for supplying each integrated phase quadrature component to a respective phase quadrature path of the complex mixing means.

4. A frequency converter as claimed in claim 1 wherein the low frequency signal has two phase quadrature components and the cross modulating means comprise:
   means for providing two phase quadrature components of the LO signal;
   means for modulating each phase quadrature component of the LO signal with a respective one of two phase quadrature components of the low frequency signal; and
   means for summing the modulation products to produce the complex modulated signal.

5. A frequency converter as claimed in claim 4 wherein the means for cross demodulating comprises:
   means for low pass filtering the resultant signal to produce a filtered signal; and
   means for mixing the filtered signal with each phase quadrature component of the low frequency signal to produce two phase quadrature components of the complex feedback signal.

6. A frequency converter as claimed in claim 5 wherein the means for supplying the complex feedback signal to the complex mixing means comprises means for integrating each phase quadrature component of the complex feedback signal and for supplying each integrated phase quadrature component to a respective phase quadrature path of the complex mixing means.

7. A frequency converter comprising an image reject mixer, for mixing an IF (intermediate frequency) signal with an LO (local oscillator) signal to produce an RF (radio frequency) signal, and a nulling circuit for providing d.c. offsets to the image reject mixer to reduce signal components at the LO frequency in the RF signal, the nulling circuit comprising:
   a source of phase quadrature chopper signals;
   means for cross modulating the LO signal with the chopper signals to produce a modulated signal;
   a single-ended mixer for mixing the modulated signal with part of the RF signal;
   means for low pass filtering the output of the single-ended mixer to produce a filtered signal;
   means for cross demodulating the filtered signal with the chopper signals to produce phase quadrature correction signals; and
   means for integrating the phase quadrature correction signals to produce the d.c. offsets for the image reject mixer.

8. A method of reducing LO (local oscillator) frequency components in an RF (radio frequency) signal produced by mixing an IF (intermediate frequency) signal with the LO signal in an image reject mixer, comprising the steps of:
   supplying phase quadrature chopper signals;
   cross modulating the LO signal with the chopper signals and summing the result to produce a complex modulated signal;
   mixing the complex modulated signal with a part of the RF signal in a single mixer and low pass filtering the result to produce a filtered signal;
   cross demodulating the filtered signal with the chopper signals to produce phase quadrature feedback signals; and
   integrating the phase quadrature feedback signals and supplying resulting d.c. offset signals to respective phase quadrature paths of the image reject mixer.

* * * * *